United States Patent [19]

Mason et al.

[11] Patent Number: 4,803,427
[45] Date of Patent: Feb. 7, 1989

[54] PRECISION MEASURING GAUGE HAVING SONIC DELAY LINE WITH FREE-STANDING MODE CONVERTER ARMATURE

[75] Inventors: Roy G. Mason, Sunnyvale; Leif Andreasen, Fremont, both of Calif.

[73] Assignee: Amcon, Inc., Sunnyvale, Calif.

[21] Appl. No.: 53,620

[22] Filed: May 26, 1987

[51] Int. Cl.$^4$ .......................... G01B 7/26; H03H 9/22; G01F 23/30; H04B 11/00
[52] U.S. Cl. ...................................... 324/207; 73/314; 324/208; 333/148
[58] Field of Search ............................... 324/207–209; 333/148; 73/313, 314

[56] References Cited

U.S. PATENT DOCUMENTS

| | | | |
|---|---|---|---|
| 2,995,736 | 8/1961 | Tellerman | 333/148 X |
| 3,011,136 | 11/1961 | Scarrott | 333/148 |
| 3,265,996 | 8/1966 | Wiseman | 333/148 |
| 3,526,857 | 9/1970 | Dickinson | 333/148 |
| 3,898,555 | 8/1975 | Tellerman | 324/208 |

Primary Examiner—Gerard R. Strecker
Attorney, Agent, or Firm—Armand G. Guibert

[57] ABSTRACT

A mode converter for a distance measuring device having a sonic delay line with a permanent magnet movable along same, the converter having a free-standing magnetostrictive armature with one end attached to the delay line and the other end terminating damplingessly within the usual coil. The armature length and shape are such that the longitudinal stress wave initiated by an electrical pulse in the coil strengthens the mechanical pulse applied to the delay line.

8 Claims, 1 Drawing Sheet

U.S. Patent
Feb. 7, 1989
4,803,427
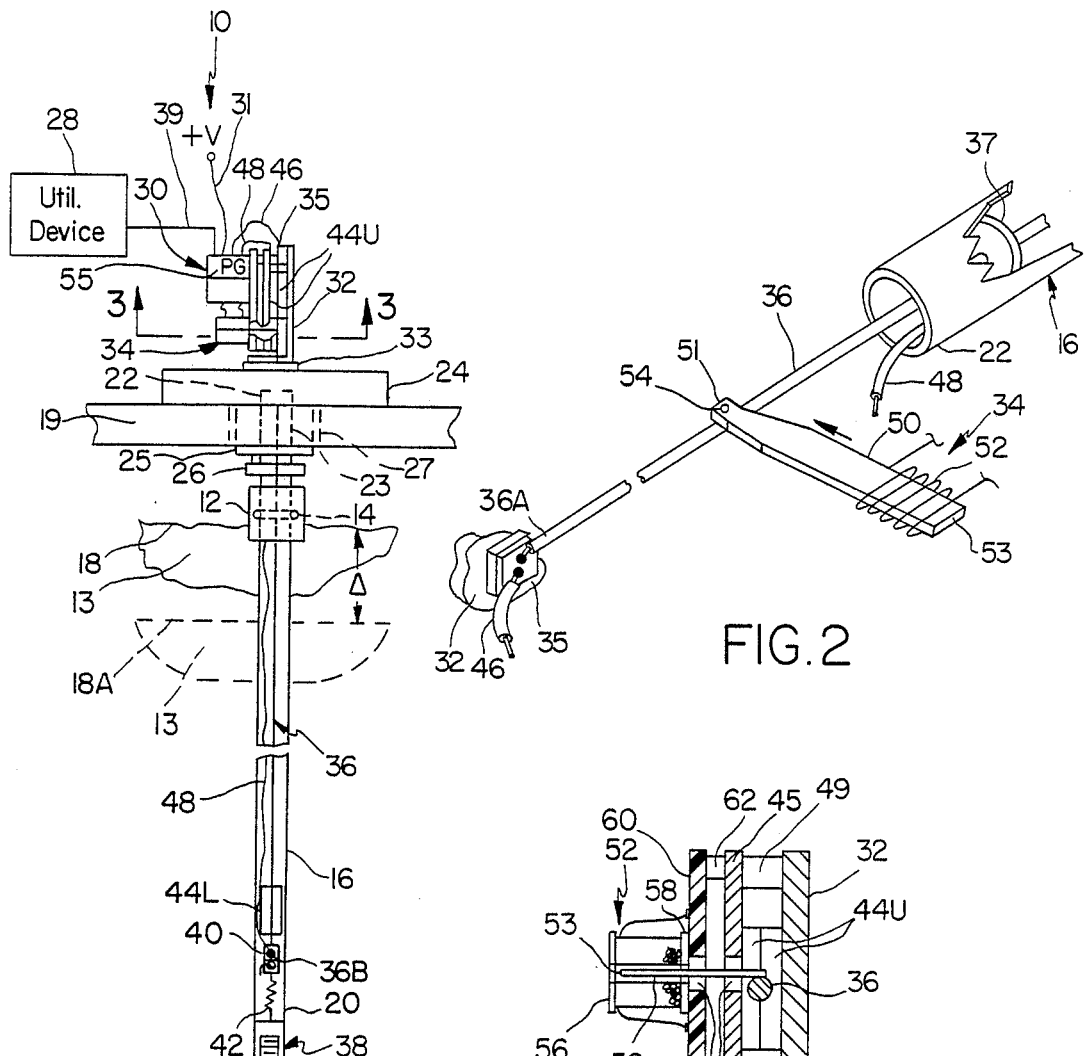
FIG. 1
FIG. 2
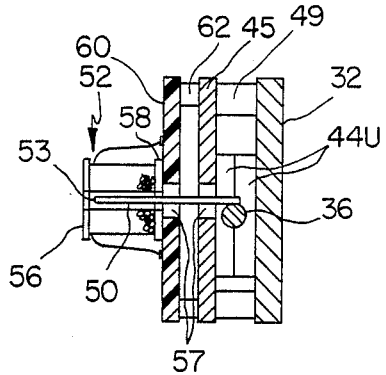
FIG. 3

PRECISION MEASURING GAUGE HAVING SONIC DELAY LINE WITH FREE-STANDING MODE CONVERTER ARMATURE

BACKGROUND OF THE INVENTION

1. Field of the Invention

The invention relates to precision measuring devices of the type utilizing sonic delay lines with a magnet movable along same and more particularly to an improved mode converter design for producing torsional pulses in the delay line.

2. Prior Art

Sonic delay lines are well known in general—e.g. U.S. Pat. Nos. 2,995,736; 3,011,136 and 3,898,555. Furthermore, their use in precision gauges has heretofore required several thin magnetostrictive (e.g. nickel) transducers—or "mode converters" as they are commonly termed—generally having one end attached to the delay line at the same axial position, but disposed at equal intervals on the periphery of the delay line for purposes of converting longitudinal stress (compression/expansion) waves into torsional waves propagating down to delay line, and vice versa. Each transducer has its other end buried in damping material after passage through a multi-loop coil of wire for generation of the stress waves or for detection of these, as the case may be.

As a result of provision for damping this other end of each transducer, the entire electronic circuit has been testable as a unit only after completion of assembly prior to transfer to inventory or just prior to shipment to the end user. Should performance problems be encountered at that point or a malfunction occur during use after shipment, a significant part of the circuitry may require disassembly, the problem isolated and the repaired or replaced members reinstalled. Such disassembly and reassembly often disturb adjustments or affect calibration with attendant need for additional operations.

Accordingly, there is yet need for further improvement in this aspect of devices of the type mentioned.

SUMMARY OF THE INVENTION

The invention relates to a linear distance measuring device having a sonic delay line, a permanent magnet movable along the delay line, a coil, a pulse generator for supplying electrical pulses to the coil, and circuit means connected to the delay line and the pulse generator; specifically, it combines therewith a mode converter comprising a free-standing magnetostrictive armature having a first end thereof rigidly attached to the periphery of the delay line at a point thereon spaced from the magnet, and having an other end thereof terminating dampinglessly within the coil. The just-mentioned coil initiates a longitudinal stress wave in the armature in response to applying to that coil an electrical pulse from the pulse generator, arrival of the longitudinal stress wave at the above-mentioned point launching a sonic torsional pulse in the delay line. The sonic torsional pulse generates an electrical signal in the delay line upon travelling past the magnet; and the circuit means are responsive to the pulse from the pulse generator and the electrical signal from the delay line for defining a time interval relating to the magnet's position with respect to the above-mentioned point on the delay line.

Features and advantages of the invention may be discerned from the foregoing discussion and the following description of a preferred embodiment of the invention when taken in conjunction with the drawing.

BRIEF DESCRIPTION OF THE DRAWING

FIG. 1 is a schematic top plan view of a precision measuring gauge utilizing the readily separable mode converter assembly with a free-standing armature according to the invention.

FIG. 2 is a perspective view of the mode converter embodiment of the present invention as utilized in the precision measuring gauge of FIG. 1.

FIG. 3 is a cross-sectional view of the mode converter assembly taken along line 3—3 of FIG. 1.

BRIEF DESCRIPTION OF THE PREFERRED EMBODIMENT

Referring to the drawing, a precision measuring gauge 10 utilizing the present invention is shown in FIG. 1. The embodiment is illustrated and will be described in terms of a linear displacement measuring device 10 based on the principles disclosed in cited U.S. Pat. No. 2,995,736 and suitable for measuring, say, liquid level in pressurized vessels, as an example. Device 10 is also useful for detecting the position of a piston in hydraulic lifts, plastic extrusion presses, etc. According to FIG. 1 then, an annular, non-magnetic Block 12 of density lower than pressurized liquid 13 and having a permanent magnet 14 molded therein moves along a straight, non-magnetic, tubular Shield 16 as liquid level 18 changes. A sonic Delay Line 36 is housed in Shield 16 and interacts with Magnet 14 of Block 12 under circumstances described shortly.

Block 12 is located in sliding, annular engagement with Shield 16 but could also be moved alongside in close proximity to it yet not actually in contact with it (by use of parallel guide wires, for example). In any case, Block 12 is supported by liquid 13, the level of which is to be measured. As the liquid level 18 changes to 18A (shown by dotted lines), Block 12 will be displaced correspondingly a distance Δ, the output on a wire 39 to a Utilization Device 28 being decreased linearly by the appropriate amount.

As shown schematically in FIG. 1, Mode Convertor 34 according to the present invention converts an electrical pulse in a Coil 52 into a longitudinal stress wave in a single, free-standing transducer Armature 50. The stress wave in Armature 50 generates, in turn, a sonic torsional pulse travelling along Delay Line 36. When the torsional pulse passes Magnet 14, an electrical signal is generated in Delay Line 36, which signal is then sent to the Electronic Circuitry 30 of Device 10 to define the time interval used in Utilization Device 28 to determine and display the position of Magnetic Block 12—i.e., level 18 of liquid 13.

An Upper End 22 of Shield 16 inserted in a central Bore 23 of a base member 24 is fastened thereto by use of a commercially available compression fitting 26, say, central bore 23 being threaded internally for that purpose. The lower end 20 of Shield 16 is unrestrained, on the other hand. Base 24 has a Stem 25 into which bore 23 extends, Stem 25 having external threads 27 to allow the entire Device 10, in turn, to be fastened in known manner to an aperture in a vessel 19 containing pressurized liquid 13 (which can have depths up to 20 feet or more). Shield 16 has a sonic Delay Line 36 stretched along its axis from Lower End 20 to a point external to the Upper End 22, as described subsequently. Delay Line 36, Mode Converter 34 and annular Block 12 cooperate with Circuitry 30 to provide data to Utilization Device 28. Circuitry 30 is also connected to a source of DC power +V via line 31. An adjusting device (not shown, but known) may also be provided to enable setting Circuitry 30 to a value identifying a home or reference position of Block 12.

The physical details of measuring device 10 will now be described. Tubular Shield 16 is illustrated in FIG. 1 as secured to Base 24 by Compression Fitting 26 cooperating with the upper end 22 of Shield 16. An L-shaped Bracket 32, held on Base 24 by known fastening techniques (e.g. screws), but in electrically isolated fashion as indicated by intercalated insulation 33, supports an anchor member 35 to which an End 26A of Delay Line 36 is soldered (see FIG. 2) together with an insulated wire 46 connecting Delay Line 36 to Circuitry 30. A Return Wire 48 similarly soldered to the other End 36B of Delay Line 36 (FIG. 1) completes the interconnection with Circuitry 30.

Bracket 32 (see FIG. 1) thus holds Delay Line 36 in substantially coaxial alignment with Shield 16. The other end of Delay Line 36 is held by a Plug 38 (described in greater detail in my co-pending application Ser. No. 053622, now abandoned entitled "Linear Transducer Housing Termination" and filed on even date herewith). Plug 38 is centered in Shield 16 at its lower end 20. Connection with Plug 38 occurs via the intermediary of a Link 40 and a Tension Spring 42, tension of which may be made variable—if desired—to allow adjustment of the tautness of Delay Line 36. Link 40 and Anchor member 35 are preferably small pieces of printed circuit board having a single conductive layer to which the delay line ends 36A, 36B may be soldered (as above mentioned) for reasons of providing coaxial alignment within Shield 16 and juncture with Wires 46,48. Known supports 37 may be provided along Delay Line 36 if warranted by the length of Device 10 (which may range up to 20 feet or more, as previously mentioned). For example, discs 37 of highly flexible, low friction, perforated silicone rubber may be slipped over Delay Line 36 at desired intervals.

As noted previously, Shield 16 is made of nonmagnetic material (brass, most stainless steels, etc.) in order to obviate any effect on the magnetic field from magnet 14 in Block 12. Also, in order to eliminate (or at least minimize) reflections of the sonic pulses from the ends of Delay Line 36, Damping Elements 44U and 44L are provided. These elements comprise, for instance, rubber pads clamped about Delay Line 36 and effectively absorb the sonic pulses passing therein. Damping Elements 44U are clamped between Bracket 32 and a flat Plate 45, the pressure being limited by presence of Spacers 49 to facilitate absorption of sonic pulses otherwise reflected at the ends of Delay Line 36. Damping Element 44L may be a lengthwise perforated or partially slit cylindrical member fitted snugly within Shield 16 near Lower End 20 so as to maintain its relative position thereafter. Such damping elements are generally known and further detailing is not necessary. According to the invention, a damping element is not provided, however, for free end 53 of Armature 50 in Mode Converter 34, as will next be described.

Proceeding now to a more detailed description of Mode Converter 34 (see FIG. 3), Delay Line 36 is seen to be a slender round wire made of 0.45/55 iron-nickel alloy and having 0.023 inch O.D. (0.58 mm). Being a metallic alloy, it is electrically conductive and thus permits generating an electric pulse (in the manner explained in U.S. Pat. No. 2,955,736) when a torsion pulse in Delay Line 36 moves past Magnet 14. As disclosed in that patent a single element can be used as the conductor for both the sonic pulse and the electrical pulse. It may also be noted from FIG. 2 that the size of Delay Line 36 in relationship to Shield 16 is not to scale. Moreover, Return Wire 48 for the electrical pulse circuit involving Delay Line 36 is also shown as enclosed in Shield 16, but spaced from Delay Line 36 by presence of the supports 37.

Armature 50 is preferably made in multiple units by chemical etching of a 0.005 inch (0.125 mm) thick sheet of pure nickel—a material providing magnetic induction changes when strained mechanically. As shown in FIGS. 2 and 3 (FIG. 2 being clearer) Armature 50 is oriented tangentially and orthogonally with respect to Delay Line 36. An End 51 of Armature 50 contacts the periphery of Delay Line 36 and is secured to it by a weldment 54 achieved in known fashion by capacitive discharge using an appropriate fixture providing the desired orientation. The other End 53 of Armature 50 lies within Coil 52 which is wound upon a Bobbin 56 (see FIG. 3) cemented to PC Board 60 (by use of a suitable known adhesive) at a position producing alignment with Armature 50, that position being established in known fashion by use of another fixture. PC Board 60, in turn, is held on Plate 45 by screws (not shown) aligning Board 60 with Corner Posts 62 affixed to Plate 45 at a predetermined distance from Armature 50. Plate 45 and PC Board 60 are provided with clearance perforations 57 through which Armature 50 is passed for entry into Coil 52 during assembly.

Upon applying a current pulse to Coil 52, the resultant magnetic field causes a contraction or expansion of the nickel, thus launching a longitudinal stress wave in Armature 50. When the stress wave in Armature 50 reaches weldment 54, the torsional pulse is formed in Delay Line 36, travelling along it thereafter. Armature 50 does not extend significantly beyond Coil 52, terminating dampinglessly with its End 53 within or substantially within Coil 52. To compensate for the absence of the usual damping material, the length of Armature 50 (about 0.7 inch) is chosen to be about a quarter wavelength longer than "N" full cycles, where N is determined by the necessary length of Coil 52 and a transition portion between different widths of Armature 50 (described below), to eliminate or at least minimize undesirable reflections from End 53. In our experience the length has not been found to be too critical, $\pm \frac{1}{2}$ inch of theoretical providing an acceptable stress wave, reflection effects being minor.

As pointed out in referenced U.S. Pat. No. 3,011,136 optimum transfer of longitudinal stress wave energy into torsional wave energy necessitates an acoustic match between Armature 50 and Delay Line 36. Such a match is achieved by applying the expression:

$$A = (\pi r^2/2n) \sqrt{G1 W1/E2 W2}$$

where A is the desired cross-sectional area of Armature 50, r the radius of the wire (36), G1 the Shear Modulus of the wire (36), E2 the Young's Modulus of Armature 50, and W1, W2 the respective densities of the wire (36) and Armature 50. In the present instance the "number of strips" n will be unity because there is only one Armature 50. For the chosen materials (nickel and a 45/55 iron-nickel alloy) and wire size (r=0.0115 inch), the resultant cross-sectional area of End 51 is 0.00015 square inch (0.097 sq. mm).

For greater efficiency, Armature 50 is made much wider (0.100 inch) in the region within Coil 52—i.e., the portion adjacent Free End 53—than the width at End 51 (0.030 inch). This is done in order to provide greater interaction with the field built up in Coil 52 by the current pulse from Pulse Generator 55. Note that the previously-mentioned transition (a linear taper being chosen for simplicity) necessitated as a result, advantageously produces an increased amplitude of the stress wave at the critical point—namely, weldment 54.

The system thus far described is preferably utilized as follows. A Pulse Generator 55 is triggered (either manually or automatically at desired time intervals) to feed an electrical pulse to Coil 52. That pulse turns ON an electronic switch (not shown, but known from U.S. Pat. No. 2,955,736), permitting clock pulses from an oscillator (likewise known, but not shown) to be applied to Utilization Device 28 via output on Wire 39. The electrical pulse to Coil 52 results in launching a longitudinal stress wave in Armature 50 of Mode Converter 34. Upon reaching End 51 of Armature 50, the stress wave is converted to a sonic torsional pulse, the torsional pulse travelling along Delay Line 36 at a predetermined velocity characteristic of the material and when the torsional pulse passes Magnet 14 an electrical signal ensues in known manner. This signal is transmitted to Circuitry 30 via conductive Delay Line 36, and the Wires 46, 48 soldered to the Ends 36A, 36B of Delay Line 36 (see FIGS. 1 and 2), turning the switch to the OFF state to disconnect the oscillator from Utilization Device 28. The value numeric in Device 28 corresponding to the number of clock pulses registered at the time of disconnection is then clearly related to the time required for the torsional pulse to travel from the current position of Magnet 14 to the fixed position of the juncture with Armature 50 of Mode Converter 34. Hence that value is representative of the new liquid level. The lower the location of Magnet 14 along Shield 16, the longer the time interval and thus the greater the number of pulses registered.

In operation, Magnet 14 will ordinarily be positioned initially at its maximum position near Base 24 or, more correctly, nearest to Armature 50. Thereafter, as Magnet 14 moves away from its reference position when liquid level 18 changes, the value obtained in response to a pulse from Generator 55 is a direct measure of the distance Magnet 14 is away from its maximum reference position and thus identifies the current liquid level. That value will be converted in the Utilization Device 28 into a height measurement indicative of that level.

Having described the invention as above, it will be clear to those skilled in the art that many changes to the described embodiment could be made without departing from the spirit and scope of the invention. For example, a single, dampinglessly terminated Armature 50 and easily removable Coil 52 would be readily adaptable to a tubular delay line of the type having a separate wire within it for transmitting an electrical pulse as a torsional pulse moves past Magnet 14.

We claim:

1. In a linear distance measuring device having an electrically conductive sonic delay line, a permanent magnet movable along the delay line, a coil, a pulse generator for supplying electrical pulses to said coil, and circuit means connected to the delay line and the pulse generator; the combination therewith of mode converter comprising a free-standing magnetostrictive armature having a first end thereof rigidly attached to the periphery of the delay line at a point thereon spaced from the magnet, and having an other end therof terminating dampinglessly within said coil, a first portion of said armature adjacent said other end thereof having a cross-sectional area determined by an internal dimension characteristic of said coil, and a second portion adjacent said first end having a second, smaller cross-sectional area determined jointly by a dimension characteristic of said delay line and by intrinsic properties of the representative materials from which said armature and said delay line are formed; a longitudinal stress wave initiated in the armature in response to an electrical pulse supplied to said coil by said pulse generator, launching a sonic torsional pulse in the delay line upon arrival at said point thereon, said sonic torsional pulse generating an electrical signal in the delay line upon travelling past said magnet; and the circuit means including timing means responsive respectively to said pulse from the pulse generator and to said electrical signal from the delay line for defining the start and end of a time interval relating to the position of the magnet with respect to said point on the delay line.

2. The linear distance measuring device of claim 1, wherein said first and second portions are connected by an intermediate portion having a cross-sectional area gradually changing from said first area to said second area.

3. The linear distance measuring device of claim 2, wherein said first and second portions are connected by an intermediate portion having a cross-sectional area linearly tapering from said first area to said second area.

4. The linear distance measuring device of claim 2, wherein said armature is of uniform thickness and said first and second portions are connected by an intermediate portion having a width linearly tapering from a first width to a second width.

5. The linear distance measuring device of claim 4, further including a printed circuit board comprising said circuit means and wherein said coil forms an integral part of said board.

6. The linear distance measuring device of claim 5 further including a base supporting said delay line, and wherein said board is releasably fastened to said base, and holds said coil aligned with said armature and in a spaced position relative to said first end of the armature such that said other end terminates substantially within said coil, and further including means for permitting motion of said coil to and from a location remote from said spaced position solely in response to releasing said board.

7. The linear distance measuring device of claim 1, further including a printed circuit board comprising said circuit means and wherein said coil forms an integral part of said board.

8. The linear distance measuring device of claim 7 further including a base supporting said delay line, and wherein said board is releasably fastened to said base, and holds said coil aligned with said armature and in a spaced position relative to said first end of the armature such that said other end terminates substantially within said coil, and further including means for permitting motion of said coil to and from a location remote from said spaced position solely in response to releasing said board.

* * * * *